US009587997B2

(12) United States Patent
Fujita et al.

(10) Patent No.: US 9,587,997 B2
(45) Date of Patent: Mar. 7, 2017

(54) MAGNETOSTRICTIVE TORQUE SENSOR AND ELECTRIC POWER STEERING APPARATUS

(71) Applicant: HONDA MOTOR CO., LTD., Tokyo (JP)

(72) Inventors: Koichi Fujita, Utsunomiya (JP); Atsuhiko Yoneda, Utsunomiya (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 15/073,272

(22) Filed: Mar. 17, 2016

(65) Prior Publication Data

US 2016/0273981 A1 Sep. 22, 2016

(30) Foreign Application Priority Data

Mar. 19, 2015 (JP) ................. 2015-055798

(51) Int. Cl.
| | |
|---|---|
| *G01L 3/10* | (2006.01) |
| *B62D 5/04* | (2006.01) |
| *B62D 6/10* | (2006.01) |
| *G01L 5/22* | (2006.01) |
| *H01L 41/12* | (2006.01) |
| *G01L 3/00* | (2006.01) |
| *G01L 3/02* | (2006.01) |

(52) U.S. Cl.
CPC ............ *G01L 3/102* (2013.01); *B62D 5/04* (2013.01); *B62D 5/0463* (2013.01); *B62D 6/10* (2013.01); *G01L 5/221* (2013.01); *G01L 3/00* (2013.01); *G01L 3/02* (2013.01); *G01L 3/101* (2013.01); *H01L 41/125* (2013.01)

(58) Field of Classification Search
CPC .. B62D 5/04; B62D 5/043; B62D 6/10; G01L 3/00; G01L 3/02; G01L 3/101; G01L 3/102; G01L 5/221; H01L 41/125
See application file for complete search history.

(56) References Cited

U.S. PATENT DOCUMENTS

| | | | | |
|---|---|---|---|---|
| 6,758,105 | B2 * | 7/2004 | Viola | G01L 3/102 73/862.08 |
| 7,497,132 | B2 * | 3/2009 | Harata | B62D 6/10 73/862.335 |
| 7,540,204 | B2 * | 6/2009 | Harata | G01L 3/102 73/862.331 |
| 8,302,492 | B2 * | 11/2012 | Shimizu | G01L 3/102 73/862.333 |
| 2006/0042404 | A1 | 3/2006 | Shimizu et al. | |

(Continued)

FOREIGN PATENT DOCUMENTS

| | | |
|---|---|---|
| JP | 2006-064445 A | 3/2006 |
| JP | 4581002 B2 | 11/2010 |

*Primary Examiner* — Kevin Hurley
*Assistant Examiner* — Marlon A Arce
(74) *Attorney, Agent, or Firm* — Carrier Blackman & Associates, P.C.; William D. Blackman; Jingli Wang

(57) ABSTRACT

A magnetostrictive torque sensor incorporated in an electric power steering apparatus includes first through fourth detection coils, which are disposed face-to-face with a magnetostrictive film across a bobbin winding holder that is disposed around an outer circumferential surface of the magnetostrictive film. A bobbin support, which supports the bobbin winding holder, is disposed on the bobbin winding holder at a central position in the axial direction of the first through fourth detection coils.

12 Claims, 5 Drawing Sheets

(56) References Cited

U.S. PATENT DOCUMENTS

| | | | | |
|---|---|---|---|---|
| 2007/0295111 | A1* | 12/2007 | Shimizu | B62D 6/10 73/862.333 |
| 2008/0099272 | A1* | 5/2008 | Shimizu | B62D 1/16 180/446 |
| 2008/0134803 | A1* | 6/2008 | Shimizu | G01L 3/102 73/862.333 |
| 2009/0114470 | A1* | 5/2009 | Shimizu | B62D 1/16 180/444 |
| 2009/0218162 | A1* | 9/2009 | Miyoshi | G01L 3/105 180/443 |
| 2009/0266179 | A1 | 10/2009 | Oniwa et al. | |
| 2012/0018241 | A1* | 1/2012 | Shimizu | B62D 6/10 180/443 |
| 2012/0137789 | A1* | 6/2012 | Arimura | B62D 6/10 73/862.335 |
| 2012/0233860 | A1* | 9/2012 | Yoneda | B62D 5/0421 29/893.1 |
| 2013/0152703 | A1* | 6/2013 | Arimura | G01L 3/102 73/862.333 |
| 2014/0326077 | A1* | 11/2014 | Yoneda | G01L 3/102 73/862.333 |

\* cited by examiner

MAGNETOSTRICTIVE TORQUE SENSOR AND ELECTRIC POWER STEERING APPARATUS

CROSS-REFERENCE TO RELATED APPLICATION

This application is based upon and claims the benefit of priority from Japanese Patent Application No. 2015-055798 filed on Mar. 19, 2015, the contents of which are incorporated herein by reference.

BACKGROUND OF THE INVENTION

Field of the Invention

The present invention relates to a magnetostrictive torque sensor having a plurality of detection coils for detecting a change in the magnetic characteristics of a magnetostrictive film disposed on an outer circumferential surface of a shaft. The present invention also relates to an electric power steering apparatus in which such a magnetostrictive torque sensor is incorporated.

Description of the Related Art

There have widely been used electric power steering apparatus, in which the steering torque of a steering wheel is detected by a magnetostrictive torque sensor, and energization of an electric motor is controlled on the basis of the detected steering torque in order to generate a steering assisting force.

In relation to magnetostrictive torque sensors of the above type, Japanese Laid-Open Patent Publication No. 2006-064445 discloses a technical concept concerning a magnetostrictive torque sensor having a shaft, a magnetostrictive film disposed on an outer circumferential surface of the shaft, and four detection coils juxtaposed along an axial direction of the shaft and disposed face-to-face with the magnetostrictive film. The detection coils detect a change in the magnetic characteristics of the magnetostrictive film, and a steering torque is calculated using a differential output (differential voltage) from the detection coils.

SUMMARY OF THE INVENTION

In the case that a magnetostrictive torque sensor is incorporated in the steering column of a vehicle, a lower portion of the magnetostrictive torque sensor may be heated locally by hot air that is delivered from the air conditioner of the vehicle to a lower area of the driver's seat, i.e., toward the feet of a driver who is seated in the driver's seat.

More specifically, as shown in FIG. 5 of the accompanying drawings, a magnetostrictive torque sensor 300 includes a bobbin winding holder 306, which is disposed around the outer circumferential surface of a magnetostrictive film 304 that is mounted on the outer circumferential surface of a shaft 302. The bobbin winding holder 306 holds four detection coils 308, 310, 312, 314, which are juxtaposed along an axial direction of the shaft 302. The bobbin winding holder 306 is fixed in position as a result of the opposite end surfaces of the holder being sandwiched between a pair of upper and lower yokes 316, 318. The upper yoke 316 is pressed against a wall surface of a sensor housing 320, and the lower yoke 318 is biased upwardly by a biasing means 322.

With such a structure, when the lower yoke 318 is heated locally by hot air from the air conditioner, heat from the lower yoke 318 is transmitted directly to the lower end of the bobbin winding holder 306. At this time, a relatively large temperature difference may temporarily be developed between the detection coil 308, which is located at the highest position in the bobbin winding holder 306, and the detection coil 314, which is located at the lowest position in the bobbin winding holder 306.

Such a temperature difference between a plurality of detection coils tends to shift the midpoint voltage, i.e., the voltage at a midpoint position of the steering angle range, of the magnetostrictive torque sensor, even though the differential output is used to calculate the steering torque, as disclosed in Japanese Laid-Open Patent Publication No. 2006-064445. If the temperature difference between the detection coils is large, then the shift in the midpoint voltage of the magnetostrictive torque sensor may become so large that a drop is likely to occur in the accuracy with which the steering angle is detected.

The present invention has been made in view of the aforementioned problems. An object of the present invention is to provide a magnetostrictive torque sensor, which is of a simple structure, for reducing a temperature difference between a plurality of detection coils, for thereby minimizing a reduction in the accuracy with which a torque that is applied to a shaft on which the magnetostrictive torque sensor is mounted is detected, as well as an electric power steering apparatus in which such a magnetostrictive torque sensor is incorporated.

To achieve the above object, in accordance with the present invention, a magnetostrictive torque sensor is provided, including a shaft, a magnetostrictive film disposed on an outer circumferential surface of the shaft, an insulative bobbin having a bobbin winding holder disposed around an outer circumferential surface of the magnetostrictive film, and a plurality of detection coils configured to detect a change in magnetic characteristics of the magnetostrictive film, the detection coils being juxtaposed on the bobbin winding holder along an axial direction of the shaft, face-to-face with the magnetostrictive film across the bobbin winding holder, wherein the bobbin includes a bobbin support disposed on the bobbin winding holder at a central position in the axial direction of the detection coils, the bobbin support being configured to support the bobbin winding holder.

With the above arrangement, even if heat is applied locally to the magnetostrictive sensor, such heat is directly transmitted through the bobbin support to the bobbin winding holder from the central position in the axial direction of the detection coils. Therefore, any temperature difference between the detection coils can be reduced by a simple structure. Therefore, since a midpoint voltage of the magnetostrictive torque sensor is prevented from being shifted, the accuracy with which a torque applied to the shaft is detected can be prevented from being lowered.

In the above magnetostrictive torque sensor, the bobbin winding holder may be supported only by the bobbin support. With such an arrangement, since heat is prevented from being directly transmitted to the bobbin winding holder from parts other than the bobbin support, any temperature difference between the detection coils can be further reduced.

The magnetostrictive torque sensor may further include a yoke disposed circumferentially around the detection coils, wherein the bobbin winding holder is kept out of contact with the yoke. With this arrangement, heat can be prevented from being transmitted directly from the yoke to the bobbin winding holder.

In the magnetostrictive torque sensor, the yoke may include a pair of yokes sandwiching the bobbin support axially therebetween, and the magnetostrictive torque sensor may further include a sensor housing in which the pair of yokes is accommodated, and a biasing mechanism disposed in the sensor housing. In this case, while one of the yokes is held against the sensor housing, the biasing mechanism biases the other one of the yokes toward the bobbin support, thereby sandwiching the bobbin support between the pair of yokes.

With such an arrangement, the bobbin winding holder and the yokes, which are held out of contact with each other, can be supported in the sensor housing by a simple structure.

According to the present invention, there also is provided a magnetostrictive torque sensor including a shaft, a magnetostrictive film disposed on an outer circumferential surface of the shaft, an insulative bobbin having a bobbin winding holder disposed around an outer circumferential surface of the magnetostrictive film, a plurality of detection coils configured to detect a change in magnetic characteristics of the magnetostrictive film, the detection coils being juxtaposed on the bobbin winding holder along an axial direction of the shaft, face-to-face with the magnetostrictive film across the bobbin winding holder, and a yoke disposed circumferentially around the detection coils, wherein a yoke support configured to support the yoke is disposed on the yoke at a central position in the axial direction of the detection coils, and the insulative bobbin is disposed on at least one of the yoke and the yoke support.

With the above arrangement, even if heat is applied locally to the magnetostrictive sensor, such heat is transmitted directly through the yoke supports to the bobbin winding holder from the central position in the axial direction of the detection coils. Therefore, any temperature difference between the detection coils can be reduced by a simple structure. Therefore, since a midpoint voltage of the magnetostrictive torque sensor is prevented from being shifted, the accuracy with which a torque applied to the shaft is detected can be prevented from being lowered.

In the above magnetostrictive torque sensor, the yoke may be supported only by the yoke support. With such an arrangement, since heat is prevented from being transmitted directly to the yoke from parts other than the yoke supports, any temperature difference between the detection coils can be further reduced.

In the magnetostrictive torque sensor, the yoke may include a pair of yokes that axially sandwich the bobbin support therebetween, the magnetostrictive torque sensor may further include a sensor housing in which the pair of yokes is accommodated, and a biasing mechanism disposed in the sensor housing. In this case, while the yoke support disposed on one of the yokes is held against the sensor housing, the biasing mechanism biases the yoke support disposed on the other one of the yokes toward the bobbin support, thereby sandwiching the bobbin support between the pair of yoke supports.

With such an arrangement, the bobbin winding holder and the yokes, which are held out of contact with each other, can be supported in the sensor housing by a simple structure.

In the magnetostrictive torque sensor, each of the yokes may be kept out of contact with the sensor housing. With this arrangement, heat is prevented from being transmitted directly from the sensor housing to the yokes.

According to the present invention, there is further provide an electric power steering apparatus including a steering wheel, a magnetostrictive torque sensor configured to detect a steering torque generated when the steering wheel is turned, and an electric motor configured to generate a steering assisting force based on an output signal from the magnetostrictive torque sensor, wherein the magnetostrictive torque sensor is the above-described magnetostrictive sensor.

With the above arrangement, the electric power steering apparatus can offer the same advantages as the above-described magnetostrictive sensor.

According to the present invention, any temperature difference between the detection coils is reduced by a simple structure. Therefore, the accuracy with which a torque applied to the shaft is detected can be prevented from being lowered.

The above and other objects, features, and advantages of the present invention will become more apparent from the following description when taken in conjunction with the accompanying drawings, in which preferred embodiments of the present invention are shown by way of illustrative example.

DESCRIPTION OF THE PREFERRED EMBODIMENTS

Electric power steering apparatus, in which magnetostrictive torque sensors according to preferred embodiments of the present invention are incorporated, will be described below with reference to the accompanying drawings.

An electric power steering apparatus 12 according to an embodiment of the present invention is applied to a vehicle such as a four-wheeled automobile, for example, and is constructed as a column-assisted electric power steering apparatus. However, the electric power steering apparatus 12 may also be constructed as a pinion-assisted or a rack-assisted electric power steering apparatus.

Figure 1:
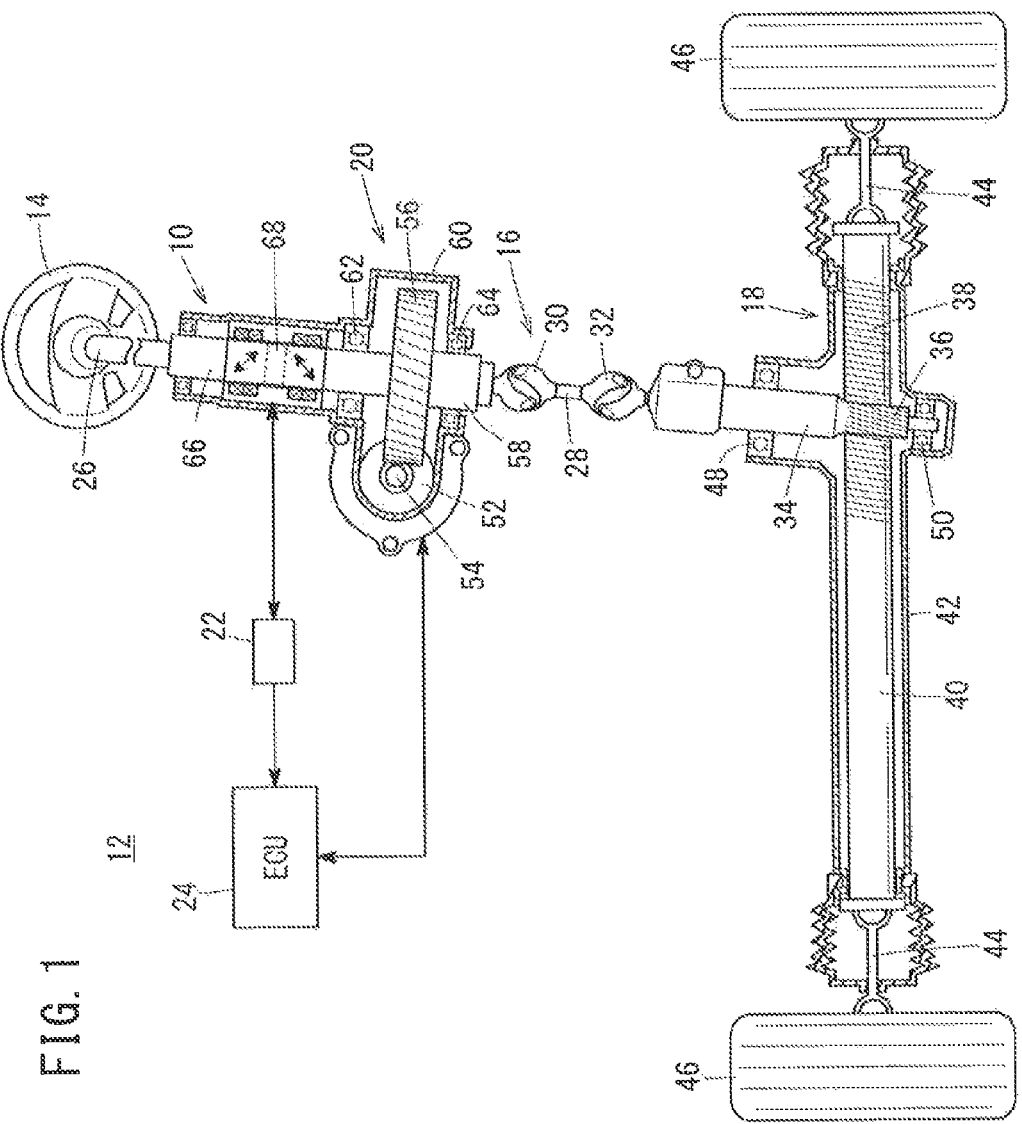
FIG. 1 is a schematic view of an electric power steering apparatus in which a magnetostrictive torque sensor according to an embodiment of the present invention is incorporated.
Figure 2:
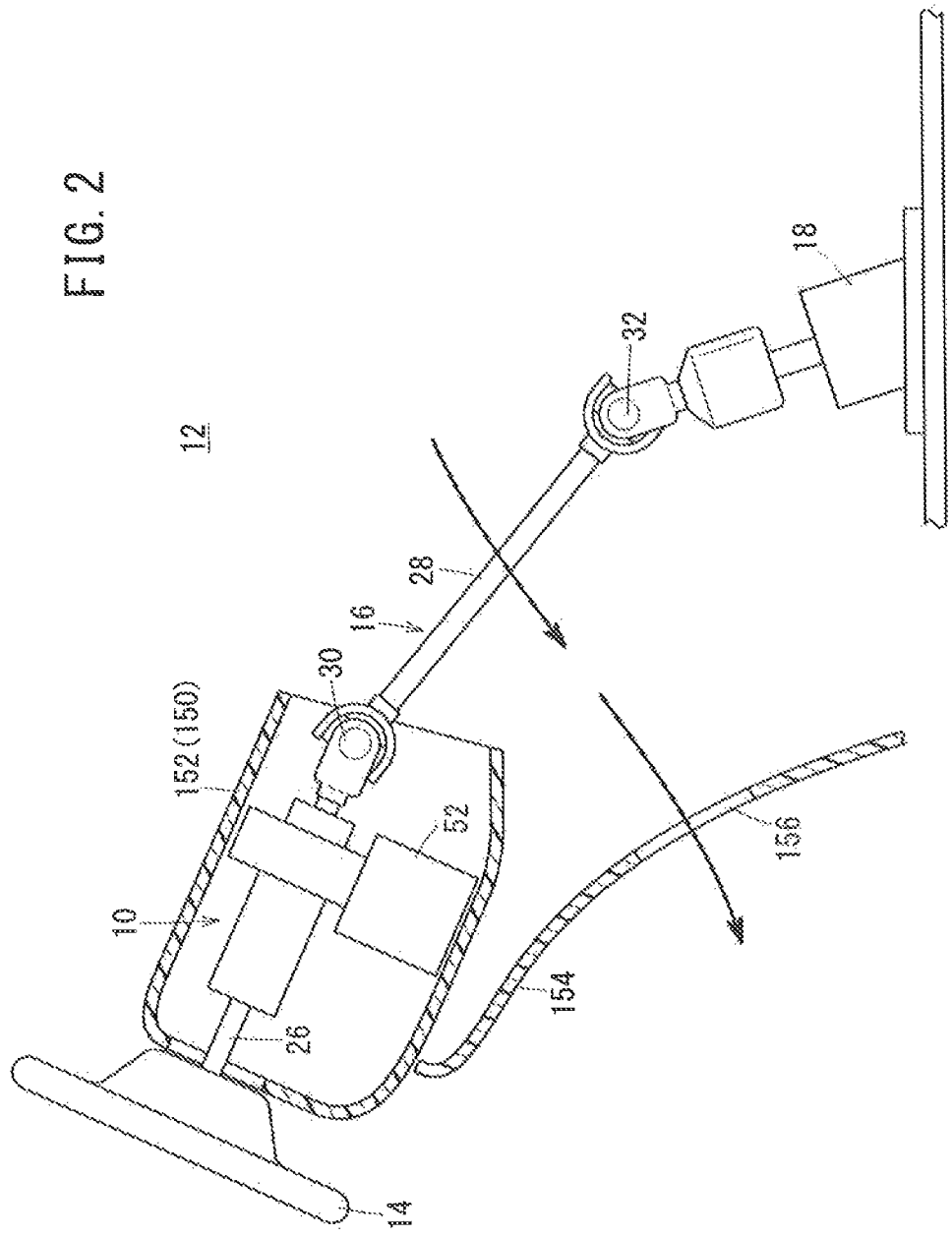
FIG. 2 is a schematic explanatory view of the electric power steering apparatus shown in FIG. 1.

As shown in FIGS. 1 and 2, the electric power steering apparatus 12 comprises a steering wheel 14 operated by the driver of the vehicle, a steering shaft 16 coupled to the steering wheel 14, a steering gear mechanism 18 and a steering assisting mechanism 20 that are combined with the steering shaft 16, a magnetostrictive torque sensor 10, a detection circuit 22, and an ECU (Electronic Control Unit) 24.

The steering shaft 16 includes an upper shaft 26 serving as an upper portion of the steering shaft 16 and which is connected to the steering wheel 14, and a lower shaft 28 serving as a lower portion of the steering shaft 16. Universal joints 30, 32 are provided, respectively, on the upper and lower ends of the lower shaft 28.

As shown in FIG. 2, with the electric power steering apparatus 12, the upper shaft 26 is housed in a column cover 152 of a steering column 150, and a dashboard 154 is disposed behind the lower shaft 28 with respect to the longitudinal direction (on the driver's seat side) of the vehicle. The dashboard 154 includes an air outlet 156 defined therein for guiding hot air from an air conditioner that is mounted in the vehicle to a lower area of the driver's seat, i.e., toward the feet of a driver who is seated on the driver's seat.

The steering gear mechanism 18 includes a pinion 34, which is connected to the lower shaft 28 by the universal joint 32, a rack 40 having a rack gear 38 that is held in mesh with pinion teeth 36 of the pinion 34, and a gear housing 42 in which the pinion 34 and the rack 40 are housed.

The rack 40 is disposed so as to be movable back and forth along a longitudinal axis of the rack 40 transversely across the vehicle. The vehicle includes steerable road wheels 46 connected to respective opposite ends of the rack 40 by respective tie rods 44. The pinion 34 has upper and lower portions rotatably supported by a plurality of (two) bearings 48, 50, which are fixedly mounted in the gear housing 42.

The steering assisting mechanism 20, which assists the driver in steering the vehicle, includes a steering assisting electric motor 52, a worm shaft 54 connected to the rotational shaft of the motor 52, a worm wheel 56 having teeth on the outer circumferential surface thereof that are held in mesh with helical teeth of the worm shaft 54, an assistive shaft 58 to which the worm wheel 56 is fixed, and an auxiliary gear housing 60. The assistive shaft 58 is rotatably supported by a plurality of (two) bearings 62, 64, which are fixed to the auxiliary gear housing 60, and the shaft 58 is connected by the universal joint 30 to the upper portion of the lower shaft 28.

Figure 3:
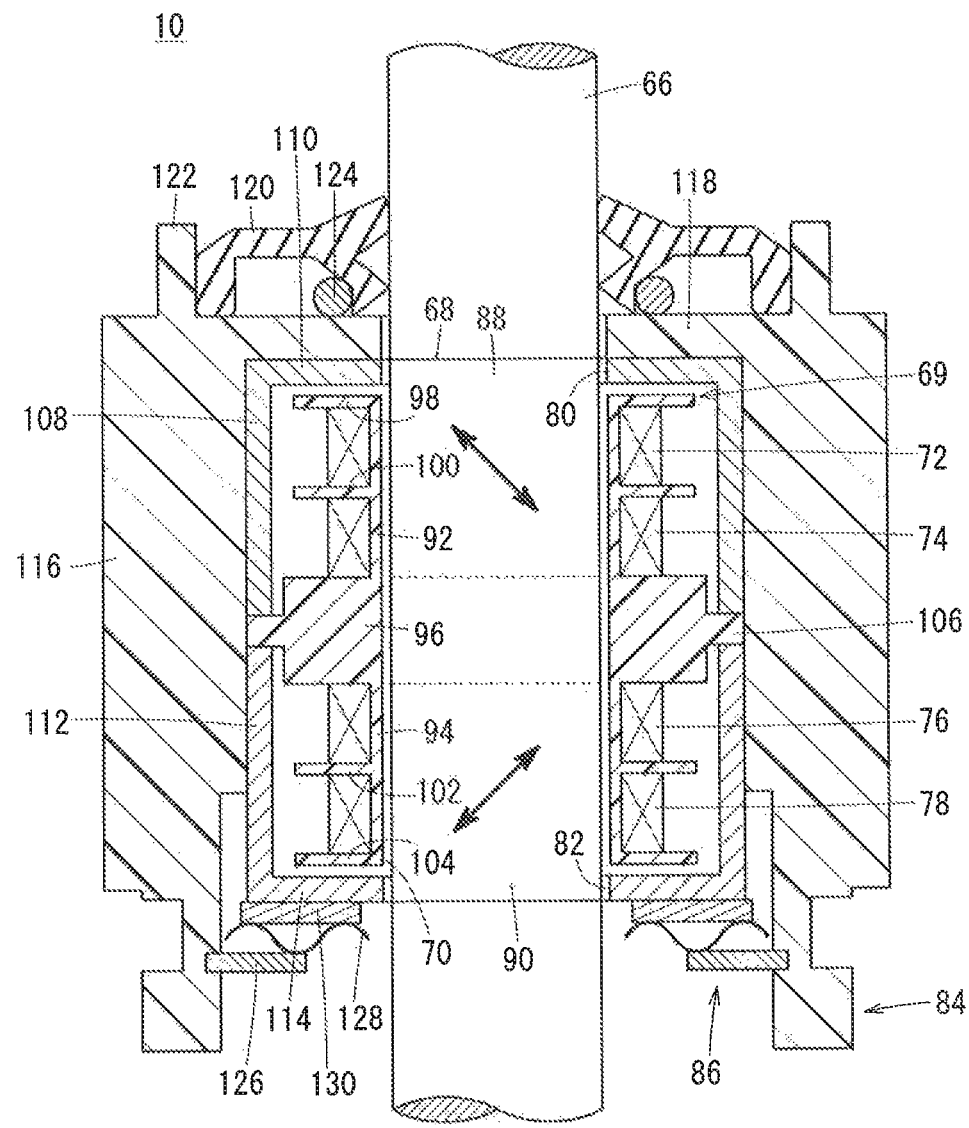
FIG. 3 is a schematic enlarged view of the magnetostrictive torque sensor shown in FIG. 1.

The magnetostrictive torque sensor 10 detects a steering torque produced by the steering wheel 14. As shown in FIG. 3, the magnetostrictive torque sensor 10 includes a shaft 66, a magnetostrictive film 68 disposed on an outer circumferential surface of the shaft 66, a bobbin 69 having a bobbin winding holder 70 disposed around the outer circumferential surface of the magnetostrictive film 68, first through fourth detection coils 72, 74, 76, 78 which are held in the bobbin winding holder 70, a first yoke 80 and a second yoke 82, which are disposed circumferentially around the first through fourth detection coils 72, 74, 76, 78, a sensor housing 84, and a biasing mechanism (biasing means) 86.

The shaft 66 includes an upper end, which is connected to the lower end of the upper shaft 26, and a lower end, which is connected to the upper end of the assistive shaft 58. The magnetostrictive film 68 comprises a film made of a material the magnetic permeability of which varies significantly when the strain in the material varies. For example, the magnetostrictive film 68 may comprise a Ni—Fe alloy film, a Co—Fe alloy film, or a Sm—Fe alloy film. The magnetostrictive film 68 may be deposited by plating, for example, on the outer circumferential surface of the shaft 66.

The magnetostrictive film 68 extends in the circumferential direction fully around the outer circumferential surface of the shaft 66. The magnetostrictive film 68 includes a first magnetostrictive area 88 and a second magnetostrictive area 90, which have different magnetic anisotropies and are spaced from one another axially with respect to the shaft 66. According to the present embodiment, the magnetostrictive film 68 includes the first magnetostrictive area 88 and the second magnetostrictive area 90. However, a magnetostrictive film including the first magnetostrictive area 88 and a magnetostrictive film including the second magnetostrictive area 90 may also be juxtaposed separately on the shaft 66 with respect to the axial direction of the shaft 66.

The bobbin 69 is integrally molded from an insulative resin material. The bobbin 69 includes the bobbin winding holder 70, which is of a hollow cylindrical shape, and a bobbin support 106 that supports the bobbin winding holder 70. The shaft 66 extends axially through a bore that is formed in the bobbin winding holder 70. The magnetostrictive film 68 and the bobbin winding holder 70 face mutually toward each other across a gap.

The bobbin winding holder 70 includes a first inner circumferential wall 92 that is disposed face-to-face with the first magnetostrictive area 88, a second inner circumferential wall 94 that is disposed face-to-face with the second magnetostrictive area 90, and an annular intermediate wall 96 disposed between the first inner circumferential wall 92 and the second inner circumferential wall 94.

The bobbin winding holder 70 also includes an annular first side wall 98, which projects radially outwardly from the end of the first inner circumferential wall 92 at a location remote from the intermediate wall 96, and an annular first partition wall 100, which projects radially outwardly from an axially central portion of the first inner circumferential wall 92. The bobbin winding holder 70 further has an annular second partition wall 102, which projects radially outwardly from an axially central portion of the second inner circumferential wall 94, and an annular second side wall 104, which projects radially outwardly from the end of the second inner circumferential wall 94 at a location remote from the intermediate wall 96.

The first detection coil 72 is formed from an electrically conductive wire, which is wound around a portion of the first inner circumferential wall 92 in the axial direction between the first side wall 98 and the first partition wall 100, and the second detection coil 74 is formed from an electrically conductive wire, which is wound around another portion of the first inner circumferential wall 92 in the axial direction between the first partition wall 100 and the intermediate wall 96. The third detection coil 76 is formed from an electrically conductive wire, which is wound around a portion of the second inner circumferential wall 94 in the axial direction between the intermediate wall 96 and the second partition wall 102, and the fourth detection coil 78 is formed from an electrically conductive wire, which is wound around another portion of the second inner circumferential wall 94 in the axial direction between the second partition wall 102 and the second side wall 104. In other words, the first through fourth detection coils 72, 74, 76, 78 are juxtaposed axially in the bobbin winding holder 70.

The first detection coil 72 and the second detection coil 74 face toward the first magnetostrictive area 88 across the first inner circumferential wall 92, and the third detection coil 76 and the fourth detection coil 78 face toward the second magnetostrictive area 90 across the second inner circumferential wall 94. The axial thickness of the intermediate wall 96 is greater than the axial thicknesses of each of the first side wall 98, the first partition wall 100, the second partition wall 102, and the second side wall 104.

The bobbin support 106 is disposed on the bobbin winding holder 70 at a central position in the axial direction of the first through fourth detection coils 72, 74, 76, 78. More specifically, the bobbin support 106 is disposed at an axial central position of the bobbin winding holder 70, on an outer circumferential surface of the intermediate wall 96. Although the bobbin support 106 is illustrated as being of an annular shape, the bobbin support 106 may be of any shape, insofar as it is capable of supporting the bobbin winding holder 70. For example, the bobbin support 106 may comprise a plurality of convex members, which project radially outwardly from the outer circumferential surface of the intermediate wall 96, and are spaced circumferentially at predetermined intervals. According to the present embodiment, the bobbin winding holder 70 and the bobbin support 106 may be formed separately from each other, with the bobbin support 106 being joined to the bobbin winding holder 70.

The first detection coil 72 and the second detection coil 74 detect a change in the magnetic characteristics of the first magnetostrictive area 88, whereas the third detection coil 76 and the fourth detection coil 78 detect a change in the magnetic characteristics of the second magnetostrictive area 90. In addition, the first through fourth detection coils 72, 74, 76, 78 function as exciting coils for exciting the magnetostrictive film 68. The structures of the first through fourth detection coils 72, 74, 76, 78 are as disclosed in Japanese Patent No. 4581002, for example. Therefore, the structural details of the first through fourth detection coils 72, 74, 76, 78 will not be described below. Output signals from the first through fourth detection coils 72, 74, 76, 78 are input through the detection circuit 22 to the ECU 24.

The first yoke 80 and the second yoke 82 are each made of a metal material such as iron or the like. The first yoke 80 and the second yoke 82 are held out of contact with the bobbin winding holder 70, and are disposed so as to axially sandwich the bobbin support 106 therebetween.

More specifically, the first yoke 80 has a first tube 108 that covers the outer circumferential sides of the first detection coil 72 and the second detection coil 74, and a first annular protrusion 110 that projects radially inwardly from the first tube 108. The first annular protrusion 110 is disposed face-to-face with the first side wall 98 of the bobbin winding holder 70, and is axially spaced therefrom by a predetermined distance, thereby forming an air gap between the first annular protrusion 110 and the first side wall 98.

The second yoke 82 has a second tube 112, which covers the outer circumferential sides of the third detection coil 76 and the fourth detection coil 78, and a second annular protrusion 114, which projects radially inwardly from the second tube 112. The second annular protrusion 114 is disposed face-to-face with the second side wall 104 of the bobbin winding holder 70, and is spaced axially therefrom by a predetermined distance, thereby forming an air gap between the second annular protrusion 114 and the second side wall 104.

The sensor housing 84 is molded integrally from a resin material, and houses therein the magnetostrictive film 68, the bobbin 69, the first through fourth detection coils 72, 74, 76, 78, the first yoke 80, and the second yoke 82. The sensor housing 84 includes a tubular housing body 116, and an annular wall 118 that extends radially inwardly from the housing body 116, and against which the first annular protrusion 110 of the first yoke 80 is held in abutment.

The sensor housing 84 includes an engagement ridge 122 on an end face (upper end face) thereof, which is engaged by an annular seal member 120. The seal member 120, which is made of rubber or the like, is pressed against the shaft 66 by a spring 124. Accordingly, by the seal member 120, lubricating oil, foreign matter, etc., is prevented from entering into the bore in the housing body 116.

The biasing mechanism 86 normally biases the second yoke 82 toward the bobbin support 106, such that the first annular protrusion 110 of the first yoke 80 is held against the annular wall 118 of the sensor housing 84, thereby sandwiching the bobbin support 106 between the first yoke 80 and the second yoke 82.

The biasing mechanism 86 includes a retainer 126 that is fixed to the housing body 116, a resilient member 128 disposed on the retainer 126, and a rest 130, which is interposed between the resilient member 128 and the second annular protrusion 114 of the second yoke 82. The retainer 126 may comprise a circlip, a C-ring, or the like. The resilient member 128 may comprise a spring such as a wave washer or the like, although the resilient member 128 may also be made of rubber or the like. The rest 130 is constituted in the form of a plate.

The detection circuit 22 calculates a first output voltage VT1 from the output signal of the first detection coil 72 and the output signal of the third detection coil 76, and outputs the calculated first output voltage VT1 to the ECU 24. Further, the detection circuit 22 calculates a second output voltage VT2 from the output signal of the second detection coil 74 and the output signal of the fourth detection coil 78, and outputs the calculated second output voltage VT2 to the ECU 24.

The ECU 24 calculates a third output voltage VT3 (differential voltage) from the difference between the first output voltage VT1 and the second output voltage VT2, which are input from the detection circuit 22, and then based on the third output voltage VT3, calculates a torque (steering torque) applied to the shaft 66. Further, based on the calculated steering torque, the ECU 24 controls driving of the motor 52 of the steering assisting mechanism 20.

The electric power steering apparatus 12 in which the magnetostrictive torque sensor 10 according to the present embodiment is incorporated basically is constructed as described above. Next, operations and advantages of the electric power steering apparatus 12 will be described.

First, when the driver turns the steering wheel 14, the steering wheel 14 applies a steering torque to the shaft 66 of the magnetostrictive torque sensor 10, so that a tensile force acts on the first magnetostrictive area 88, and a compressive force acts on the second magnetostrictive area 90, for example. As a result, the magnetic permeability of the first magnetostrictive area 88 decreases, thereby reducing the inductance of the first detection coil 72 and the second detection coil 74, whereas the magnetic permeability of the second magnetostrictive area 90 increases, thereby increasing the inductance of the third detection coil 76 and the fourth detection coil 78.

The output signal from the first detection coil 72 and the output signal from the third detection coil 76 are converted by the detection circuit 22 into the first output voltage VT1, which is supplied to the ECU 24. In addition, the output signal from the second detection coil 74 and the output signal from the fourth detection coil 78 are converted by the detection circuit 22 into the second output voltage VT2, which is supplied to the ECU 24. The ECU 24 calculates a third output voltage VT3 from the difference between the first output voltage VT1 and the second output voltage VT2, and calculates a steering torque based on the third output voltage VT3. The ECU 24 controls driving of the steering assisting electric motor 52 based on the calculated steering torque. The driving force generated by the motor 52 is transmitted to the steering shaft 16 as a steering assisting force through the worm shaft 54 and the worm wheel 56. Therefore, the steering force applied by the driver can be assisted appropriately.

According to the present embodiment, when hot air from the air conditioner is supplied to the lower portion of the driver's seat in a cold climate or during the winter or the like, the lower portion of the magnetostrictive torque sensor 10 is heated locally by the hot air, which is delivered to the air outlet 156 that is defined in the dashboard 154. At this time, the lower portion of the sensor housing 84 and the second yoke 82 may become higher in temperature than the other components that make up the magnetostrictive torque sensor 10.

According to the present embodiment, however, the bobbin support 106 is disposed on the bobbin winding holder 70 at a central position in the axial direction of the first through fourth detection coils 72, 74, 76, 78. Therefore, heat from the sensor housing 84 and the second yoke 82 is transmitted directly through the bobbin support 106 to the intermediate wall 96 of the bobbin winding holder 70. Such heat, which is guided to the intermediate wall 96, is dispersed into the upper and lower portions of the bobbin winding holder 70, thereby heating the first through fourth detection coils 72, 74, 76, 78. In this manner, any temperature difference between the first through fourth detection coils 72, 74, 76, 78 can be reduced. Therefore, since the third output voltage (midpoint voltage) VT3 at the midpoint position of the steering angle range is prevented from being shifted, the accuracy with which the torque applied to the shaft 66 is detected can be prevented from becoming unduly lowered.

According to the present embodiment, the bobbin winding holder 70 is kept out of contact with the first yoke 80 and the second yoke 82, and is supported only by the bobbin support 106. Consequently, heat can be prevented from being transmitted directly to the bobbin winding holder 70 from parts (i.e., the first yoke 80 and the second yoke 82) other than the bobbin support 106. Thus, any temperature difference between the first through fourth detection coils 72, 74, 76, 78 can be further reduced.

According to the present embodiment, while the first annular protrusion 110 of the first yoke 80 (one yoke) is held against the annular wall 118 of the sensor housing 84, the biasing mechanism 86 biases the second yoke 82 (other yoke) toward the bobbin support 106, thereby sandwiching the bobbin support 106 between the first yoke 80 and the second yoke 82. Therefore, the bobbin winding holder 70 and the first yoke 80 (second yoke 82), which are held out of contact with each other, can be supported in the sensor housing 84 by a simple structure.

A magnetostrictive torque sensor 10a according to a modification will be described below with reference to FIG. 4. Constituent elements of the magnetostrictive torque sensor 10a according to the modification, which have identical or similar functions and advantages to those of the above-described magnetostrictive torque sensor 10, are denoted by identical reference numerals, and such features will not be described in detail below.

Figure 4:
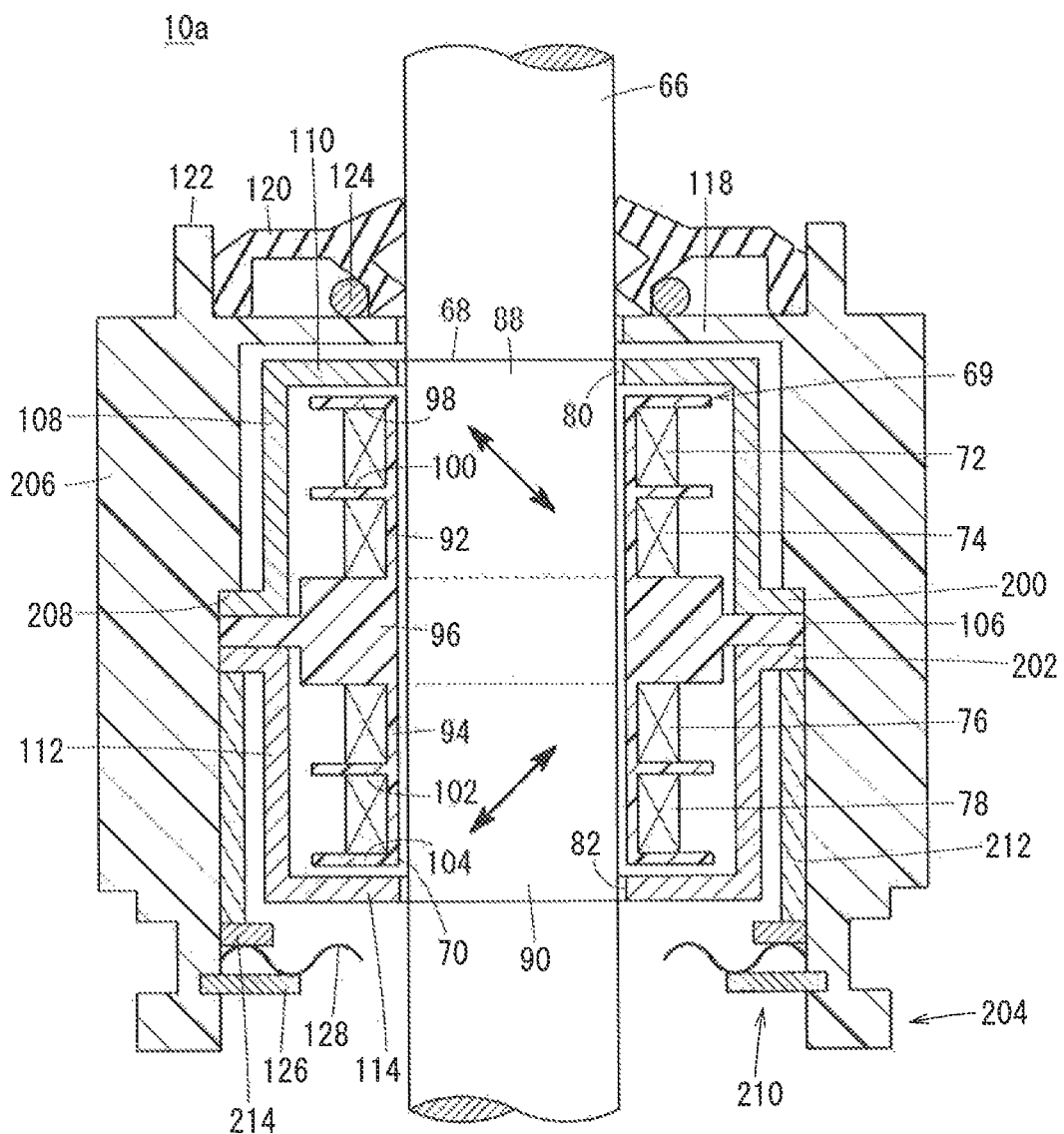
FIG. 4 is a schematic enlarged view of a magnetostrictive torque sensor according to a modification.
Figure 5:
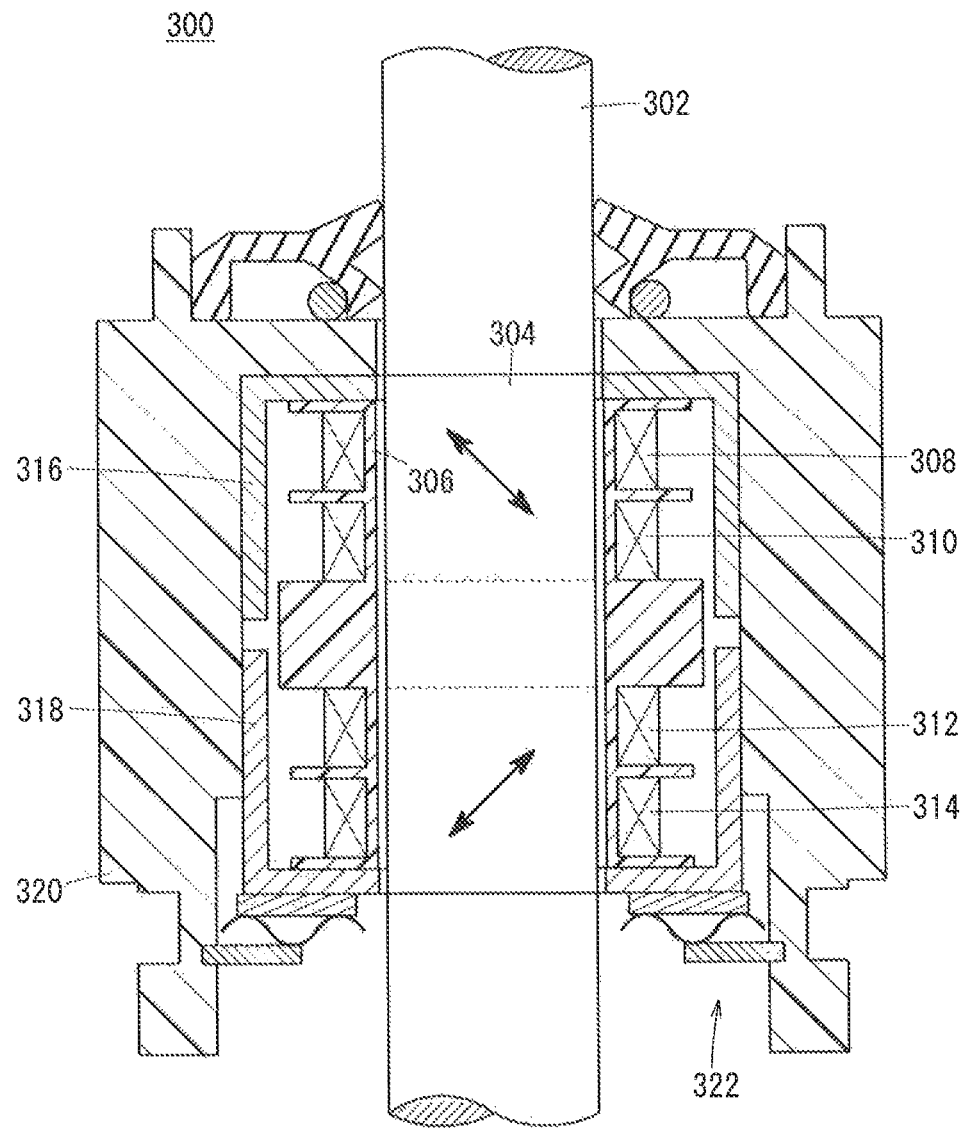
FIG. 5 is a schematic enlarged view of a magnetostrictive torque sensor according to a reference example.

As shown in FIG. 4, the magnetostrictive torque sensor 10a includes a first yoke support 200, which is disposed on the first yoke 80 at a central position, i.e., at a position located face-to-face with the intermediate wall 96, in the axial direction of the first through fourth detection coils 72, 74, 76, 78, and a second yoke support 202, which is disposed on the second yoke 82 at a central position, i.e., at a position located face-to-face with the intermediate wall 96, in the axial direction of the first through fourth detection coils 72, 74, 76, 78.

The first yoke support 200 is of an annular shape and is formed integrally with the first tube 108. However, the first yoke support 200 may be formed in a different shape, insofar as the first yoke support 200 is capable of supporting the first yoke 80. For example, the first yoke support 200 may comprise a plurality of convex members, which project radially outwardly from the outer circumferential surface of the first tube 108, and are spaced circumferentially at predetermined intervals.

According to the present modification, the first yoke 80 and the first yoke support 200 may be formed separately from each other, and the first yoke support 200 may be joined to the first yoke 80.

The second yoke support 202 is of a similar structure to the first yoke support 200, and thus will not be described in detail below. The second yoke support 202 may be formed in a different shape, similar to the case of the first yoke support 200.

The housing body 206 of the sensor housing 204 includes a step formed at a position on the inner circumferential surface thereof corresponding to the first yoke support 200. The step has a surface 208 directed downwardly along the axial direction of the shaft 66 toward a region in which the second annular protrusion 114 is positioned.

A biasing mechanism (biasing means) 210 includes a retainer 126, a resilient member 128, an engagement member 212, which is held in contact with the second yoke support 202, and a rest 214, which is interposed between the engagement member 212 and the resilient member 128. The engagement member 212 is formed in a hollow cylindrical shape, which is positioned radially outwardly from the second yoke 82 in spaced relation thereto. Alternatively, the engagement member 212 may comprise an array of rod-shaped members, which are circumferentially disposed around the second yoke 82, for example.

The magnetostrictive torque sensor 10a offers the same advantages as the aforementioned magnetostrictive torque sensor 10. The first yoke 80 is kept out of contact with the sensor housing 204, and is supported only by the first yoke support 200. In addition, the second yoke 82 is kept out of contact with the sensor housing 204, and is supported only by the second yoke support 202. Consequently, heat is prevented from being transmitted directly to the first yoke 80 from parts (i.e., the sensor housing 204) other than the first yoke support 200. Further, heat is prevented from being transmitted directly to the second yoke 82 from parts (i.e., the sensor housing 204) other than the second yoke support 202. Thus, any temperature difference between the first through fourth detection coils 72, 74, 76, 78 can be further reduced.

While the first yoke support 200 is held against the surface 208 of the step of the sensor housing 204, the biasing mechanism 210 biases the second yoke support 202 toward the bobbin support 106, thereby sandwiching the bobbin support 106 between the first yoke support 200 and the second yoke support 202. Therefore, the bobbin 69 and the first yoke 80 (second yoke 82), which are held out of contact with each other, are supported in the sensor housing 204 by a simple structure.

According to this modification, the bobbin support 106 may be sandwiched between the first tube 108 and the second tube 112, without being placed in contact with the annular first yoke support 200 on the outer circumferential surface of the first tube 108, and the annular second yoke support 202 on the outer circumferential surface of the second tube 112.

The magnetostrictive torque sensor and the electric power steering apparatus according to the present invention are not limited to the above embodiments, but various additional or alternative arrangements may be adopted therein without departing from the scope of the present invention.

The magnetostrictive torque sensor is not limited to the structure having the four detection coils, but may have two detection coils or a plurality of detection coils other than four. The magnetostrictive torque sensor is not limited to being applied to an electric power steering apparatus, but may be applied to various different apparatus.

The bobbin winding holder may comprise a single component, as described above in the aforementioned embodiments, or may comprise a plurality of components. If the bobbin winding holder comprises a plurality of components, then the bobbin winding holder may comprise an upper winding holder that holds a first detection coil and a second detection coil, and a lower winding holder that holes a third detection coil and a fourth detection coil, in such a manner that the upper and lower winding holders are joined to each other.

What is claimed is:

1. A magnetostrictive torque sensor comprising:
   a shaft;
   a magnetostrictive film disposed on an outer circumferential surface of the shaft;
   an insulative bobbin having a bobbin winding holder disposed around an outer circumferential surface of the magnetostrictive film; and
   a plurality of detection coils configured to detect a change in magnetic characteristics of the magnetostrictive film, the detection coils being juxtaposed on the bobbin winding holder along an axial direction of the shaft, face-to-face with the magnetostrictive film across the bobbin winding holder;
   wherein the bobbin includes a bobbin support disposed on the bobbin winding holder at a central position in an axial direction of the detection coils, the bobbin support being configured to support the bobbin winding holder; and
   wherein the bobbin winding holder is supported only by the bobbin support.

2. The magnetostrictive torque sensor according to claim 1, further comprising:
   a yoke disposed circumferentially around the detection coils;
   wherein the bobbin winding holder is kept out of contact with the yoke.

3. The magnetostrictive torque sensor according to claim 2, wherein the yoke comprises a pair of yokes sandwiching the bobbin support axially therebetween;
   the magnetostrictive torque sensor further comprising:
   a sensor housing in which the pair of yokes is accommodated; and
   a biasing mechanism disposed in the sensor housing;
   wherein, while one of the yokes is held against the sensor housing, the biasing mechanism biases another one of the yokes toward the bobbin support, thereby sandwiching the bobbin support between the pair of yokes.

4. A magnetostrictive torque sensor comprising:
   a shaft;
   a magnetostrictive film disposed on an outer circumferential surface of the shaft;
   an insulative bobbin having a bobbin winding holder disposed around an outer circumferential surface of the magnetostrictive film;
   a plurality of detection coils configured to detect a change in magnetic characteristics of the magnetostrictive film, the detection coils being juxtaposed on the bobbin winding holder along an axial direction of the shaft, face-to-face with the magnetostrictive film across the bobbin winding holder; and
   a yoke disposed circumferentially around the detection coils;
   wherein a yoke support configured to support the yoke is disposed on the yoke at a central position in an axial direction of the detection coils; and
   the insulative bobbin is disposed on at least one of the yoke and the yoke support.

5. The magnetostrictive torque sensor according to claim 4, wherein the yoke is supported only by the yoke support.

6. The magnetostrictive torque sensor according to claim 4, wherein the bobbin includes a bobbin support disposed on the bobbin winding holder at a central position in the axial direction of the detection coils, the bobbin support being configured to support the bobbin winding holder.

7. The magnetostrictive torque sensor according to claim 6, wherein the bobbin winding holder is supported only by the bobbin support.

8. The magnetostrictive torque sensor according to claim 6, wherein the bobbin winding holder is kept out of contact with the yoke.

9. The magnetostrictive torque sensor according to claim 6, wherein:
   the yoke comprises a pair of yokes sandwiching the bobbin support axially therebetween;
   the magnetostrictive torque sensor further comprising:
   a sensor housing in which the pair of yokes is accommodated; and
   a biasing mechanism disposed in the sensor housing;
   wherein, while the yoke support disposed on one of the yokes is held against the sensor housing, the biasing mechanism biases another yoke support disposed on another one of the yokes toward the bobbin support, thereby sandwiching the bobbin support between the yoke supports.

10. The magnetostrictive torque sensor according to claim 9, wherein each of the yokes is kept out of contact with the sensor housing.

11. An electric power steering apparatus comprising:
    a steering wheel;
    a magnetostrictive torque sensor configured to detect a steering torque generated when the steering wheel is turned; and
    an electric motor configured to generate a steering assisting force based on an output signal from the magnetostrictive torque sensor;
    wherein the magnetostrictive torque sensor comprises:
    a shaft;
    a magnetostrictive film disposed on an outer circumferential surface of the shaft;
    an insulative bobbin having a bobbin winding holder disposed around an outer circumferential surface of the magnetostrictive film; and
    a plurality of detection coils configured to detect a change in magnetic characteristics of the magnetostrictive film, the detection coils being juxtaposed on the bobbin winding holder along an axial direction of the shaft, face-to-face with the magnetostrictive film across the bobbin winding holder;
    wherein the bobbin includes a bobbin support disposed on the bobbin winding holder at a central position in an axial direction of the detection coils, the bobbin support being configured to support the bobbin winding holder; and
    wherein the bobbin winding holder is supported only by the bobbin support.

12. An electric power steering apparatus comprising:
    a steering wheel;
    a magnetostrictive torque sensor configured to detect a steering torque generated when the steering wheel is turned; and
    an electric motor configured to generate a steering assisting force based on an output signal from the magnetostrictive torque sensor;
    wherein the magnetostrictive torque sensor comprises:
    a shaft;

a magnetostrictive film disposed on an outer circumferential surface of the shaft;

an insulative bobbin having a bobbin winding holder disposed around an outer circumferential surface of the magnetostrictive film;

a plurality of detection coils configured to detect a change in magnetic characteristics of the magnetostrictive film, the detection coils being juxtaposed on the bobbin winding holder along an axial direction of the shaft, face-to-face with the magnetostrictive film across the bobbin winding holder; and a yoke disposed circumferentially around the detection coils;

wherein a yoke support configured to support the yoke is disposed on the yoke at a central position in an axial direction of the detection coils; and the insulative bobbin is disposed on at least one of the yoke and the yoke support.

* * * * *